United States Patent
Lee et al.

(10) Patent No.: US 8,551,841 B2
(45) Date of Patent: Oct. 8, 2013

(54) IO ESD DEVICE AND METHODS FOR FORMING THE SAME

(75) Inventors: Tung Ying Lee, Hsin-Chu (TW); Wen-Huei Guo, Chu-Bei (TW); Chih-Hao Chang, Chu-Bei (TW); Shou-Zen Chang, Panchiao (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/345,473

(22) Filed: Jan. 6, 2012

(65) Prior Publication Data

US 2013/0175578 A1    Jul. 11, 2013

(51) Int. Cl.
*H01L 21/336* (2006.01)

(52) U.S. Cl.
USPC ........... 438/283; 438/481; 438/157; 438/164; 438/299; 438/149; 257/401; 257/308; 365/149; 324/762.09

(58) Field of Classification Search
USPC ......... 438/283, 481, 157, 164, 299, 149, 183, 438/197, 254, 268, 513; 257/401, 308; 365/149; 324/762.09
See application file for complete search history.

(56) References Cited

U.S. PATENT DOCUMENTS

| | | | |
|---|---|---|---|
| 7,173,310 B2 * | 2/2007 | Voldman et al. | 257/350 |
| 7,700,449 B2 | 4/2010 | Lee | |
| 8,258,602 B2 * | 9/2012 | Ke et al. | 257/586 |
| 2004/0188705 A1 * | 9/2004 | Yeo et al. | 257/170 |
| 2006/0273372 A1 * | 12/2006 | Voldman et al. | 257/308 |
| 2009/0315112 A1 * | 12/2009 | Lee | 257/355 |
| 2010/0187656 A1 * | 7/2010 | Ke et al. | 257/586 |

\* cited by examiner

*Primary Examiner* — Telly Green
(74) *Attorney, Agent, or Firm* — Slater & Matsil, L.L.P.

(57) ABSTRACT

A method includes forming an ESD diode including performing an epitaxy growth to form an epitaxy region comprising silicon and substantially free from germanium. The epitaxy region is doped with a p-type impurity to form a p-type region, wherein the p-type region forms an anode of the ESD diode.

12 Claims, 13 Drawing Sheets

IO ESD DEVICE AND METHODS FOR FORMING THE SAME

BACKGROUND

In Input/output (IO) circuits, large diodes occupying large chip areas are needed for Electro-Static Discharge (ESD) protection. For the ESD diodes, the ability to discharge ESD currents is partially determined by the sizes of the diodes. Accordingly, the diodes are designed as large as possible. Furthermore, required by design rules, the sizes of the anodes and cathodes of the diodes affect the widths of the metal lines directly over the respective anodes and cathodes. Accordingly, to gain good electro-migration performance of the metal lines directly over the diodes, the ESD diodes are designed to have large anode pickup regions and/or large cathode pickup regions, rather than comprising many narrow anode pickup regions and/or narrow cathode pickup regions.

When the process for forming the ESD diodes is integrated with the process for forming Fin Field-Effect Transistors (FinFETs), the large anode pickup regions and/or large cathode pickup regions may be formed by epitaxially growing the pickup regions from semiconductor fins, and the epitaxy regions grown from neighboring fins are merged to form large pickup regions. It has been found, however, that some of the large epitaxy regions may have much smaller thickness than small epitaxy regions that are formed simultaneously. As a result, significant leakage currents were generated in the ESD diodes.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 6 are top views and cross-sectional views of intermediate stages in the manufacturing of an Electro-Static Discharge (ESD) diode and an n-type device in accordance with various embodiments; and FIGS. 7A through 9 are top views and cross-sectional views of intermediate stages in the manufacturing of a p-type device in accordance with embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An Electro-Static Discharge (ESD) diode and the method of forming the same are provided in accordance with various embodiments. The intermediate stages of forming the ESD diode are illustrated. The variations and the operation of the embodiments are discussed. Throughout the various views and illustrative embodiments, like reference numbers are used to designate like elements.

Figure 1A:
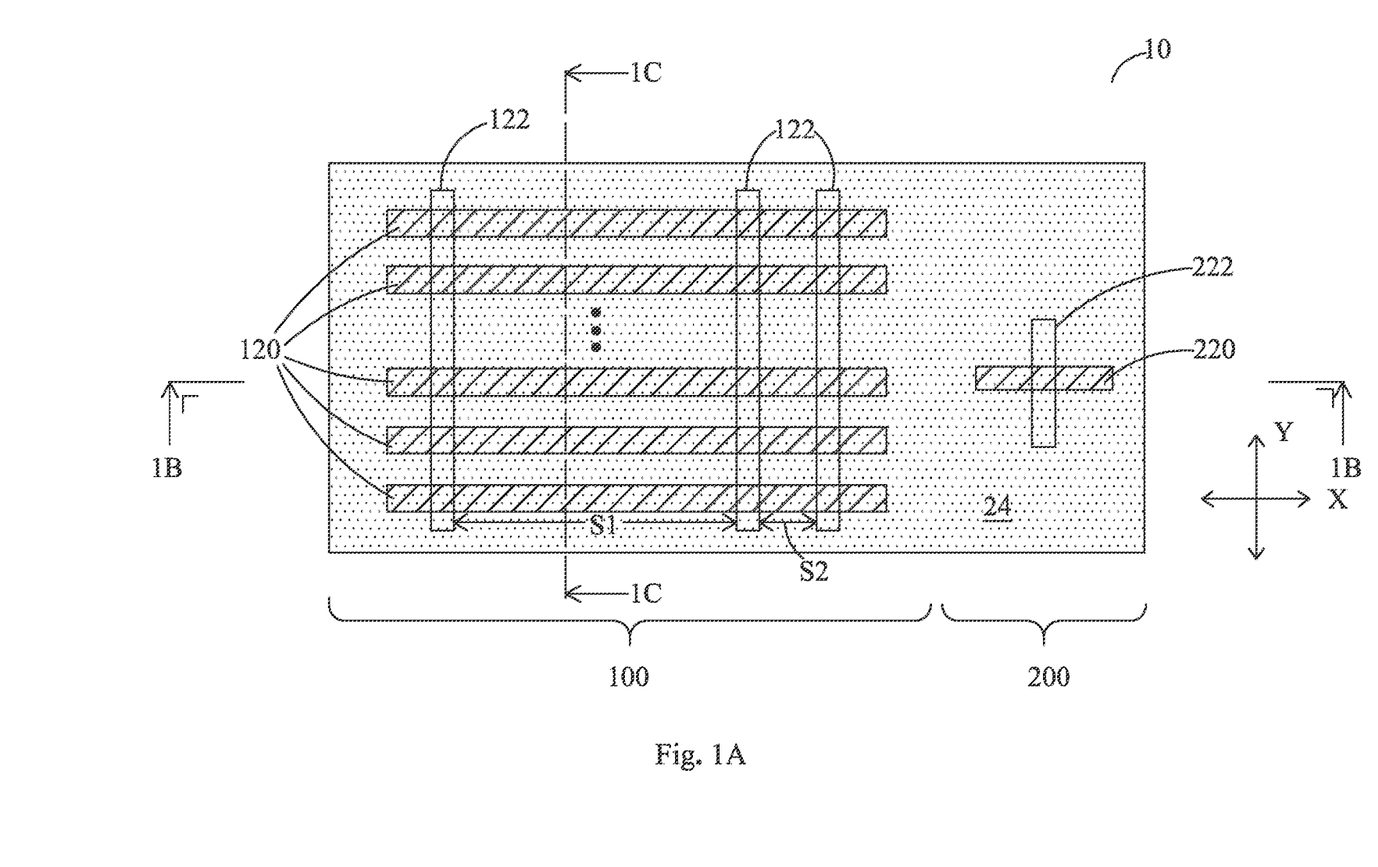
Figure 5:
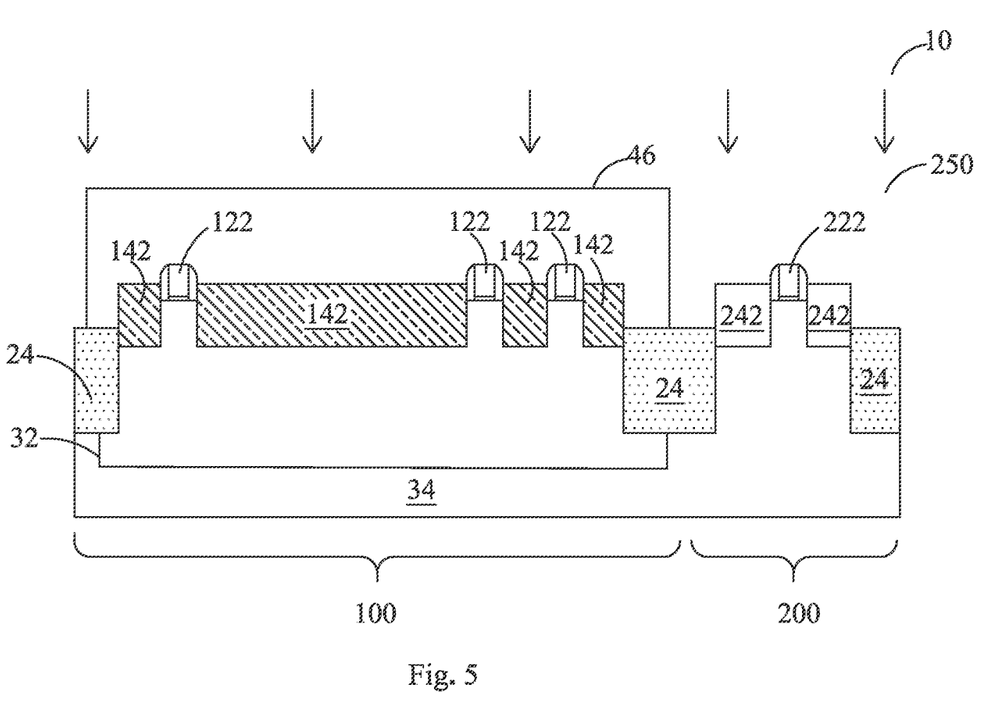

FIG. 1A illustrates a top view of a structure for forming the ESD diode. Chip 10 (which is a part of wafer, and hence is referred to as wafer/chip 10 hereinafter) includes device regions 100 and 200. Device region 100 is an ESD device region, which may also be an Input/output (IO) region for forming IO devices. Device region 200 is an n-type device region, in which an n-type device is to be formed. The n-type device may be an n-type core transistor (such as a FinFET), an n-type 10 transistor, a Static Random Access Memory (SRAM) device, an n-type IO ESD device, or the combination thereof. Device 250 as shown in FIG. 5 represents the n-type device that is formed in device region 200.

Figure 6:
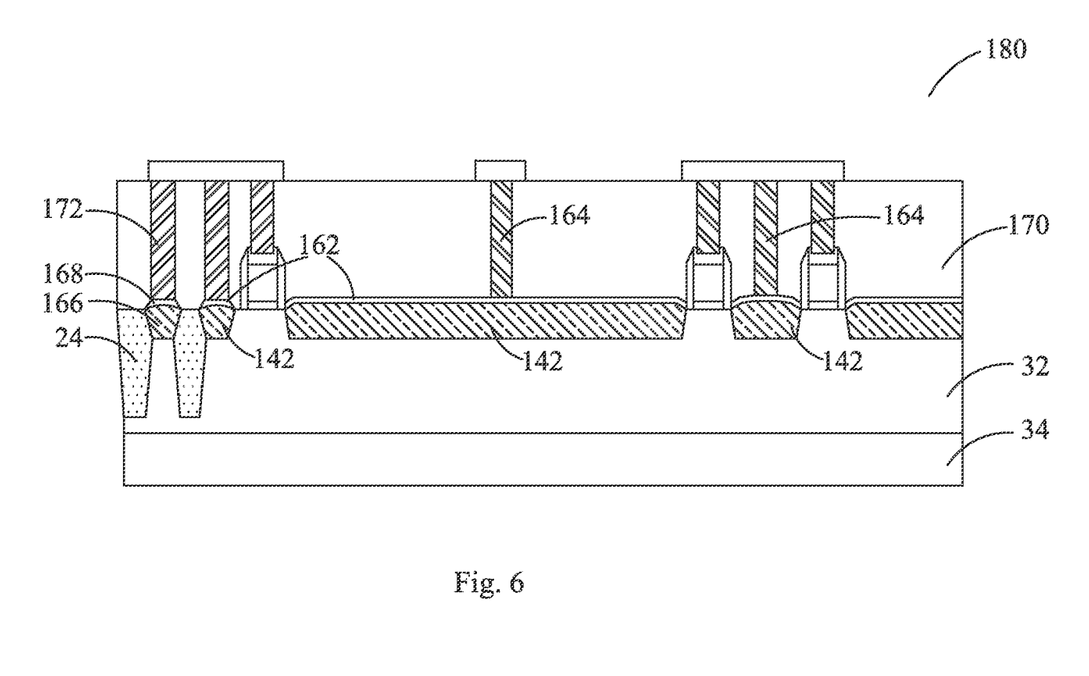

A plurality of semiconductor fins (which may be silicon fins) 120 are formed in device region 100. Semiconductor fins 120 are parallel to each other, and may have a substantially uniform spacing, or may have non-uniform spacings. In the illustrated embodiments, the lengthwise direction of semiconductor fins 120 is referred to as the X-direction. A plurality of gate electrodes 122 are formed crossing semiconductor fins 120. The lengthwise direction of gate electrodes 122 is in the Y-direction, which is perpendicular to the X-direction. Portions of gate electrodes 122 are on the sidewalls of portions of semiconductor fins 120. In some embodiments, in addition to forming on the sidewalls of the portions of semiconductor fins 120, gate electrodes 122 also extend over and overlapping the top surfaces of semiconductor fins 120. Gate electrodes 122 are separated from semiconductor fins 120 by gate dielectrics (not shown in FIG. 1A, please refer to gate dielectrics 126 in FIG. 1B). Gate electrodes 122 may be dummy gates in the resulting ESD device 180 (FIG. 6). In some embodiments, the spacing between some of gate electrodes 122 may be different from the spacings between other neighboring ones of gate electrodes 122. For example, spacing S1 between two neighboring gate electrodes 122 may be greater than spacing S2 between two other neighboring gate electrodes 122. In alternative embodiments, gate electrodes 122 may have a uniform spacing. Shallow Trench Isolation (STI) regions 24 are formed between and around semiconductor fins 120 in the top view.

FIG. 1A also illustrates that semiconductor fin 220 is formed in device region 200, and gate electrode 222 is formed crossing semiconductor fin 220. A portion of gate electrode 222 is on the top surface and sidewalls of semiconductor fin 220. Gate electrode 222 has a lengthwise direction perpendicular to the lengthwise direction of semiconductor fin 220.

Figure 1B:
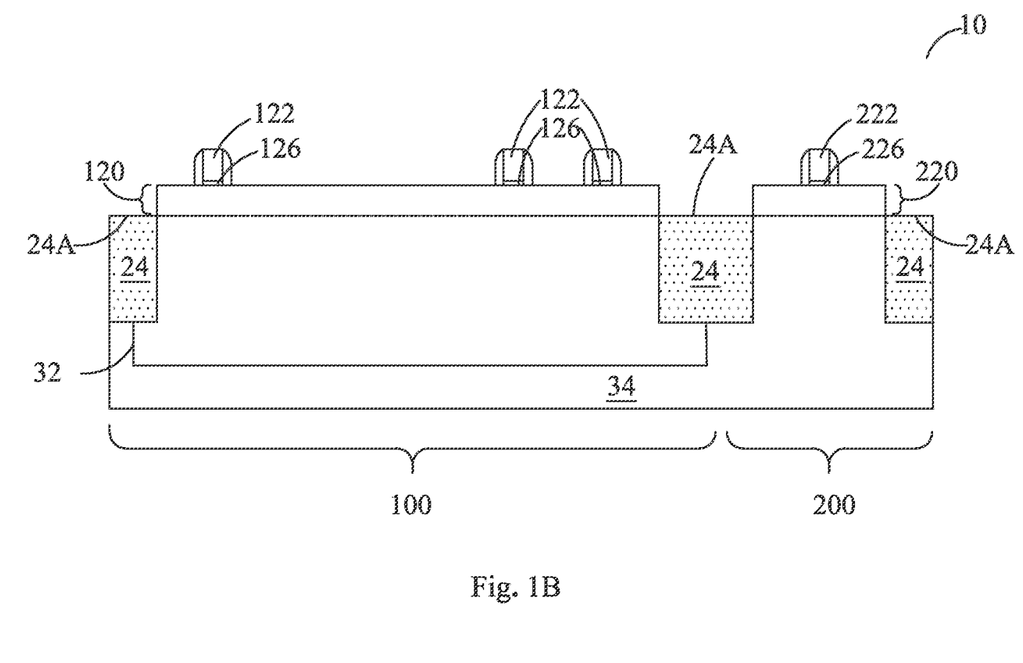

FIG. 1B illustrates a cross-sectional view of the structure shown in FIG. 1A, wherein the cross-sectional view is obtained from the plane crossing line 1B-1B in FIG. 1A. It is shown that semiconductor fin 120 is the portion of semiconductor substrate 34. Semiconductor fin 120 is higher than the top surface 24A of STI region 24. Gate dielectric 126 is formed on the top surface of fin 120. Gate dielectric 126 and gate electrode 122 also extend on the sidewalls of fin 120, although not shown in FIG. 1B. N-well region 32 is formed in semiconductor substrate 34. In some embodiments, semiconductor substrate 34 is a silicon substrate. Alternatively, semiconductor substrate 34 may be formed of other semiconductor materials such as silicon germanium, III-V compound semiconductor materials, or the like. Semiconductor substrate 34 may be lightly doped with a p-type impurity. Similarly, the cross-sectional view of semiconductor fin 220 and gate electrode 222 is also illustrated.

Figure 1C:
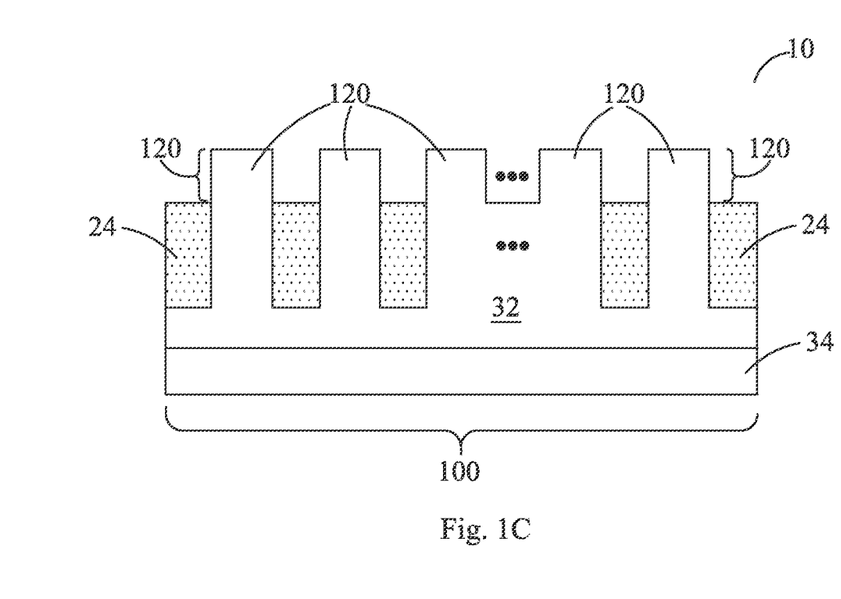

FIG. 1C illustrates a cross-sectional view of the structure shown in FIG. 1A, wherein the cross-sectional view is obtained from the plane crossing line 1C-1C in FIG. 1A. It is observed that semiconductor fins 120 extend above STI regions 24, and are adjacent to each other.

Figure 2A:
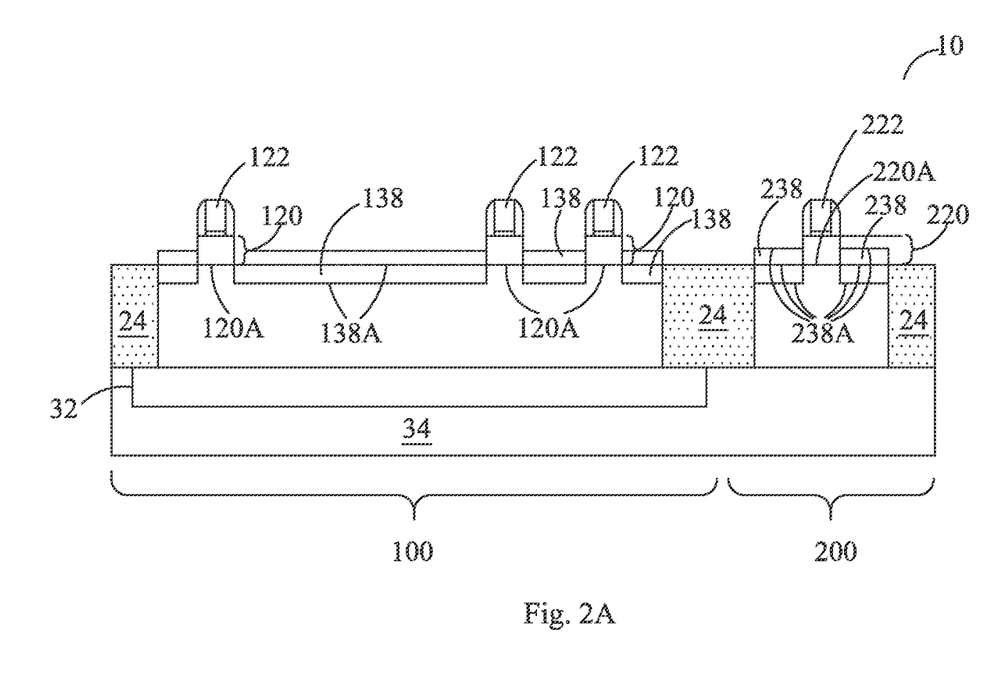
Figure 2B:
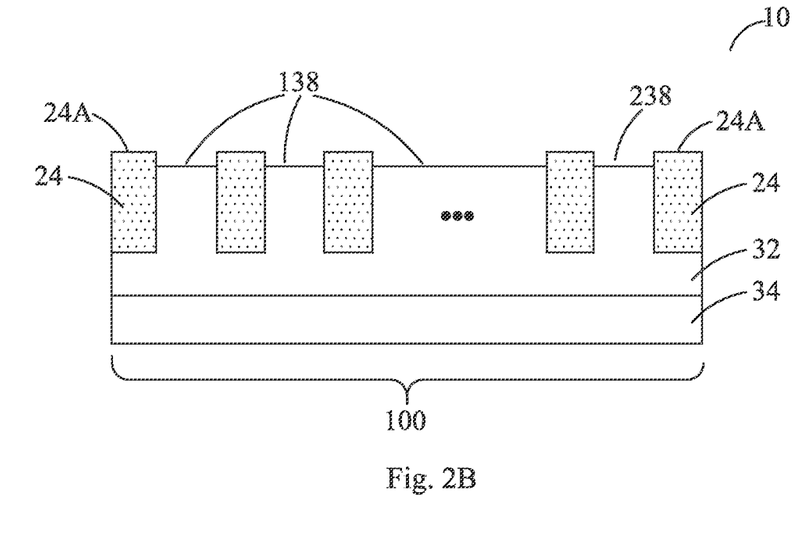
Figure 3A:
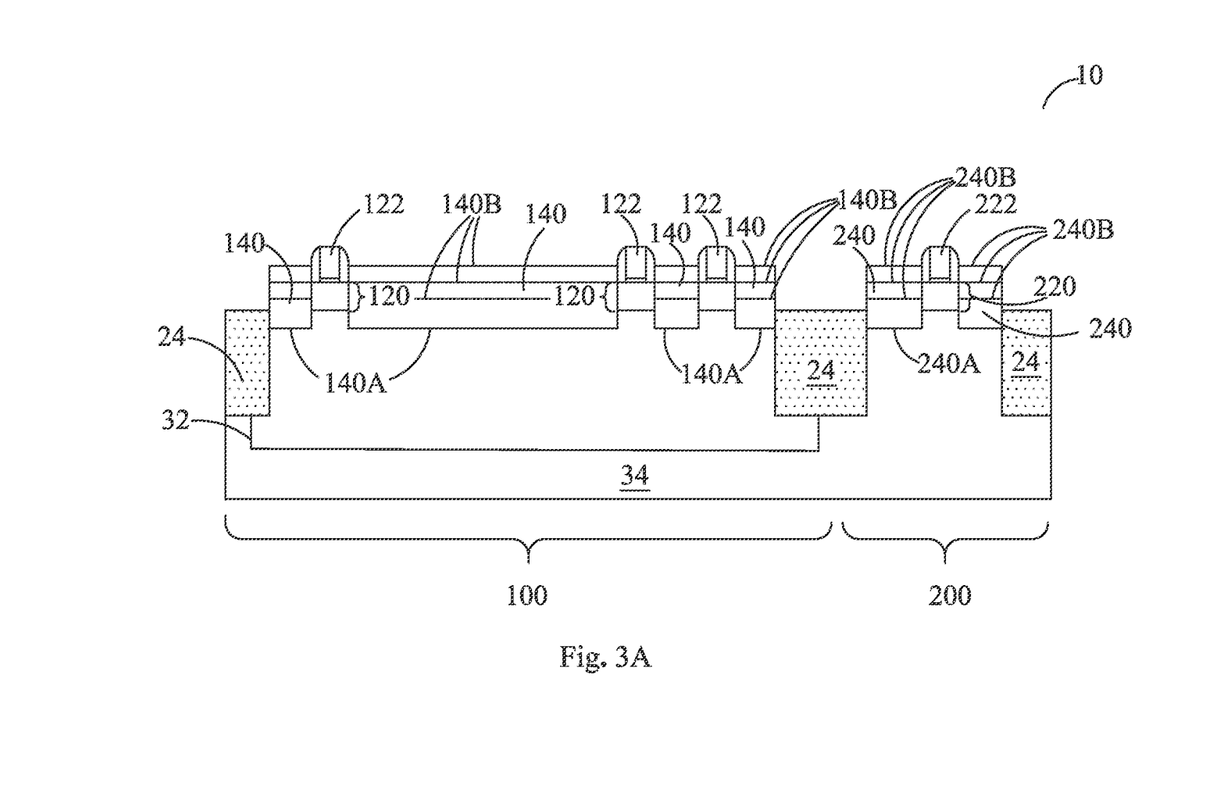

Referring to FIG. 2A, a recessing step is performed to etch semiconductors fins 120 and 220 simultaneously. As a result, recesses 138 are formed in device region 100 and between neighboring gate electrodes 122. In the meantime, recesses 238 are formed in device region 200 and adjacent to semiconductor fin 220. Some portions of semiconductor fins 120 covered by gate electrodes 122 and the portion of semiconductor fin 220 covered by gate electrode 222 are protected, and are not etched. In some embodiments, bottom surfaces 138A of recesses 138 and bottom surfaces 238A of recesses 238 are lower than bottom surfaces 120A of fins 120 and bottom surface 220A of fin 220. In alternative embodiments, bottom surfaces 138A and 238A, as illustrated using dashed lines, may be substantially level with, or higher than, bottom surfaces 120A and 220A. In yet other embodiments, no recess step is performed, and the epitaxy step as shown in FIG. 3A is performed on the un-etched semiconductor fins 120 and 220. FIG. 2B illustrates the structure of FIG. 2A, with the cross-sectional view obtained from the same plane crossing line 1C-1C in FIG. 1A.

FIG. 3A illustrates the epitaxy for growing epitaxy regions 140 and 240. FIG. 3A is obtained from the same plane crossing line 1B-1B in FIG. 1A. In some embodiments, epitaxy regions 140 and 240 are formed of substantially pure silicon, with no germanium (or substantially no germanium, for example, less than about 2 atomic percent) added. In alternative embodiments, epitaxy regions 140 and 240 are formed of other materials (such as silicon carbon, silicon phosphorous, or the like) that are suitable for forming n-type devices such as nMOS transistors. Epitaxy regions 140 and 240 may be substantially neutral in conductivity type, wherein no n-type or p-type impurity is in-situ doped when epitaxy regions 140 and 240 are grown. In alternative embodiments, an n-type impurity, such as phosphorous, arsenic, or the like, may be doped in-situ with the proceeding of the formation of epitaxy regions 140 and 240. Due to the epitaxy process, regardless of whether epitaxy regions 140 and 240 are formed of a same material (such as silicon) as the material of underlying n-well region 32 or not, visible interfaces 140A and 240A may be generated between n-well region 32 and the overlying epitaxy regions 140 and 240, respectively. Interfaces 140A and 240A may be observed using Scanning Electron Microscopy (SEM), for example. The epitaxy step may be performed using a Chemical Vapor Deposition (CVD) method, and silane ($SiH_4$) may be used as a precursor, although other applicable methods and/or precursors may be used. The top surfaces 140B and 240B may be higher than the top surfaces of fins 120 and 220. Top surfaces 140B and 240B may also be level with, or lower than, the top surfaces of fins 120 and 220. Some possible top surfaces 140B and 240B are illustrated using dashed lines.

Figure 3B:
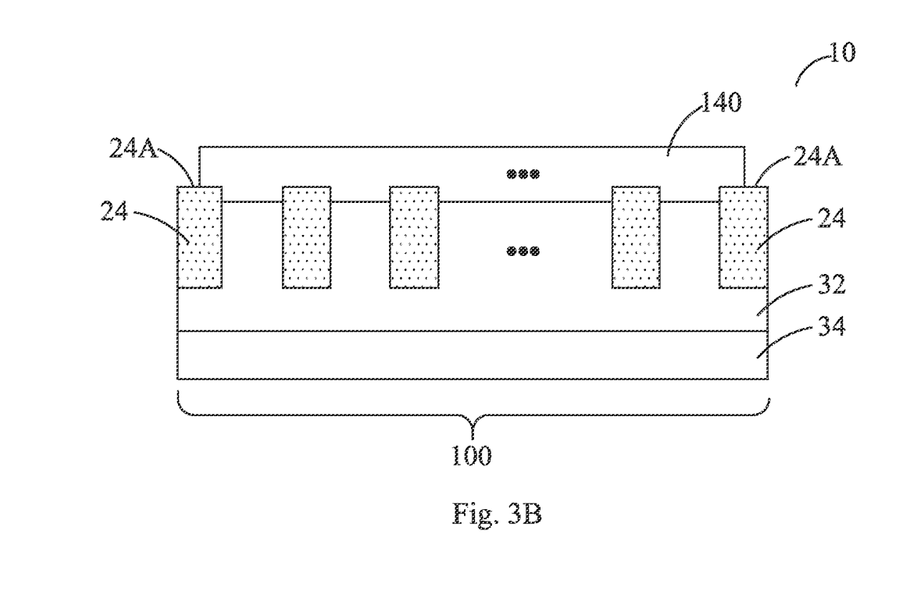
Figure 3C:
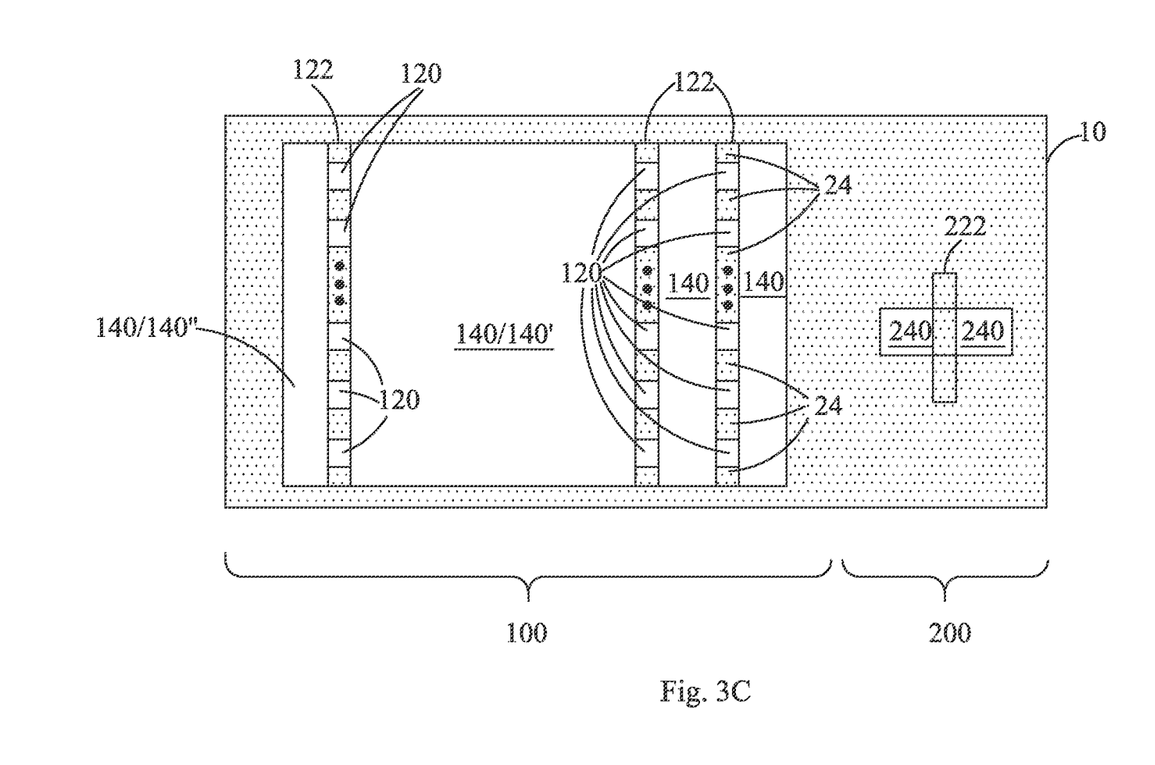

FIG. 3B illustrates a cross-sectional view of the structure shown in FIG. 3A, wherein the cross-sectional view is obtained from the same plane crossing line 1C-1C in FIG. 1A. Epitaxy regions 140, when grown above the top surfaces 24A of STI regions 24, also have a lateral growth in addition to the vertical growth. As a result, the semiconductor material grown from neighboring recesses 138 (FIG. 2B) merge together to form the large epitaxy region 140 that expands on the top of multiple STI regions 24. As shown in FIG. 3C, which is a top view of the structures shown in FIGS. 3A and 3B, the large epitaxy region 140 expands to substantially the entire region between neighboring gate electrode 122.

Figure 4:
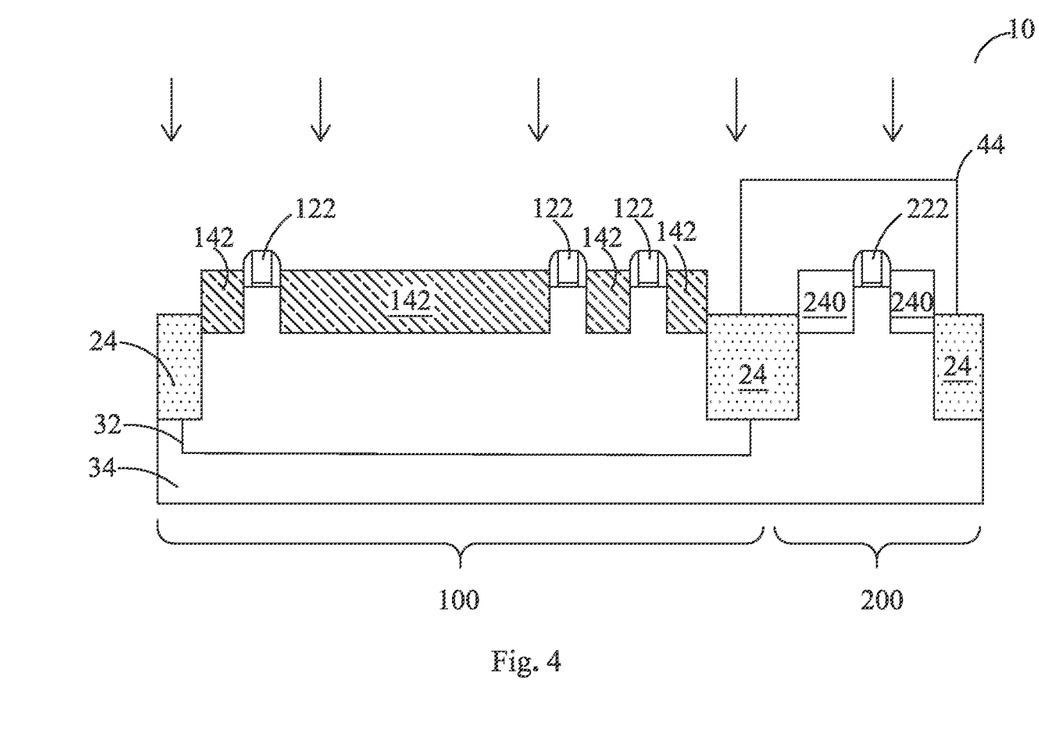

FIG. 4 illustrates implanting a p-type impurity into epitaxy regions 140 to form p-type regions 142. In some embodiments, p-type regions 142 are heavily doped, for example, to an impurity concentration higher than about $10^{19}/cm^3$, or between about $10^{19}/cm^3$ and about $10^{21}/cm^3$, although a higher or a lower impurity concentration may be used. The implanted impurity may comprise boron, indium, or the like. At the time the p-type impurity is implanted, device region 200 is masked, for example, by photo resist 44, so that epitaxy regions 240 are not implanted with the p-type impurity.

FIG. 5 illustrates the implantation of an n-type impurity into epitaxy regions 240 to form n-type regions 242. In some embodiments, n-type regions 242 are heavily doped, for example, to an impurity concentration higher than about $10^{19}/cm^3$, or between about $10^{19}/cm^3$ and about $10^{21}/cm^3$, although a higher or a lower impurity concentration may be used. The implanted impurity may comprise phosphorous, arsenic, antimony, or the like. At the time the n-type impurity is implanted, device region 100 may be masked, for example, by photo resist 46. Accordingly, p-type regions 142 are not implanted with the n-type impurity. As a result, n-type device 250 is formed. N-type device 250 may be an n-type core FinFET, an n-type IO FinFET, an n-type FinFET in a SRAM cell, an n-type IO ESD device, or the like. It is realized that the order of the steps shown in FIGS. 4 and 5 may be inversed, and the n-type impurity may be implanted into epitaxy regions 240 before the implantation of the p-type impurity into epitaxy regions 140.

FIG. 6 illustrates the formation of silicide region 162 and contact plugs 164. In addition, FIG. 6 also illustrates n-type pickup region 166 and the respective overlying silicide region 168. N-type pickup region 166 may be formed using essentially the same method as for forming p-type epitaxy regions 142, and may be formed simultaneously as the formation of p-type epitaxy regions 142. N-type pickup region 166 may also be heavily doped as an N+ region. Silicide regions 162 and 168 may be formed by depositing a metal layer (not shown) over p-type epitaxy regions 142 and n-type pickup region 166, and performing an annealing to form silicide regions 162 and 168, respectively. Un-reacted portion of the metal layer are then removed, leaving silicide regions 162 and 168. Dielectric layer 170, which may be an inter-layer dielectric, is formed, and then contact plugs 164 and 172 are formed in dielectric layer 170 and electrically couple to p-type epitaxy regions 142 and n-type pickup region 166, respectively. P-type epitaxy region 142, n-well region 32, and n-type pickup region 166 form ESD diode 180. P-type epitaxy region 142 acts as the anode, n-well region 32 acts as the cathode, and n-type pickup region 166 acts as the cathode pickup region of ESD diode 180. Although not shown, the plurality of p-type regions 142 as shown in FIG. 4 may be interconnected through contact plugs and metal lines to further increase the interface areas between p-type regions 142 and n-well region 32.

In some embodiments, contact plug 172 and anode 32 may be coupled to a VSS node such as electrical ground (GND), while contact plug 164 and anode 142 may be coupled to a positive power supply node VDD (such as VDDIO). Conversely, a reversed connection scheme may also be used, wherein contact plug 164 and anode 142 may be coupled to the VSS node, while contact plug 172 and anode 32 may be coupled to the positive power supply node VDD. Alternatively, each of contact plugs 164 and 172 may be coupled to an IO input pad or an IO output pad. Due to the large interface area between p-type epitaxy regions 142, n-well region 32, and n-type pickup region 166, ESD diode 180 may have a high ESD current.

FIGS. 7A through 9 illustrate the formation of a p-type device 302 (in illustrative FIG. 9) on semiconductor substrate 34, which is the same semiconductor substrate on which ESD diode 180 (FIG. 6) and n-type device 250 (FIG. 5) are formed. The process steps shown in 7A through 9 are performed separately from the steps in FIGS. 1A through 6. In addition, the lithography masks (not shown) that are used in the process steps shown in FIGS. 1 through 6 may be different from the lithography masks used in the process steps shown in FIGS. 7A through 9, wherein the lithography masks comprise opaque patterns and transparent patterns. Accordingly, the formation process as shown in FIGS. 7A through 9 is decoupled from the formation of ESD diode 180 as shown in FIGS. 1A through 6.

Figure 7A:
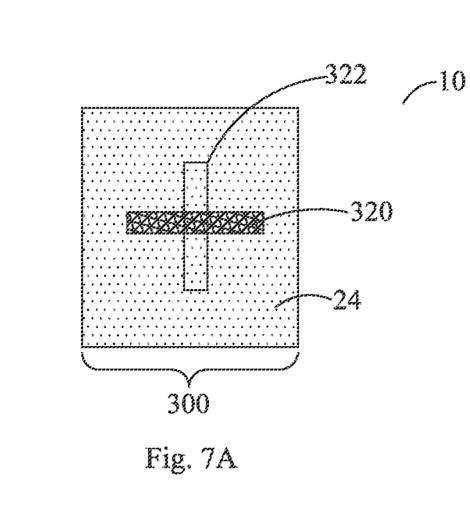
Figure 7B:
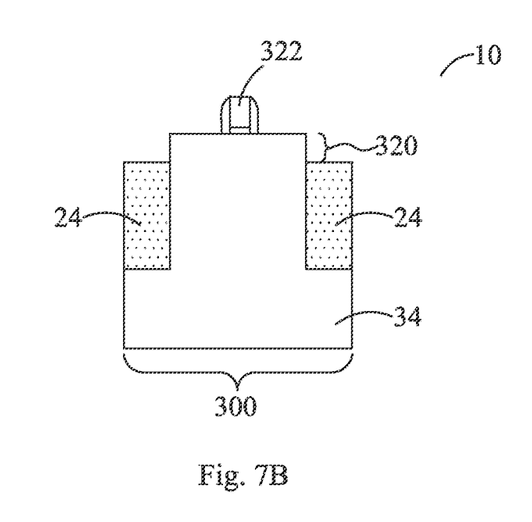
Figure 8:
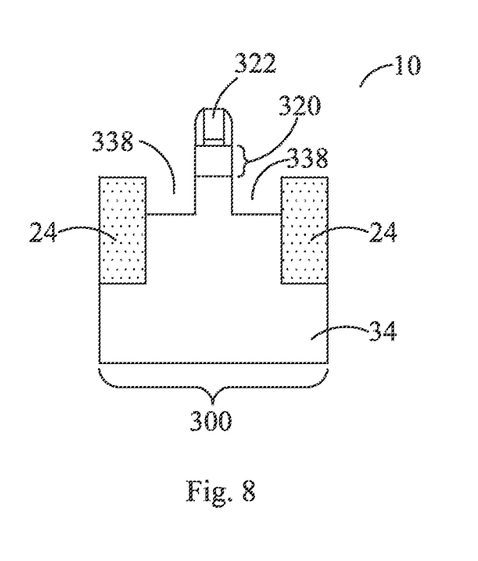
Figure 9:
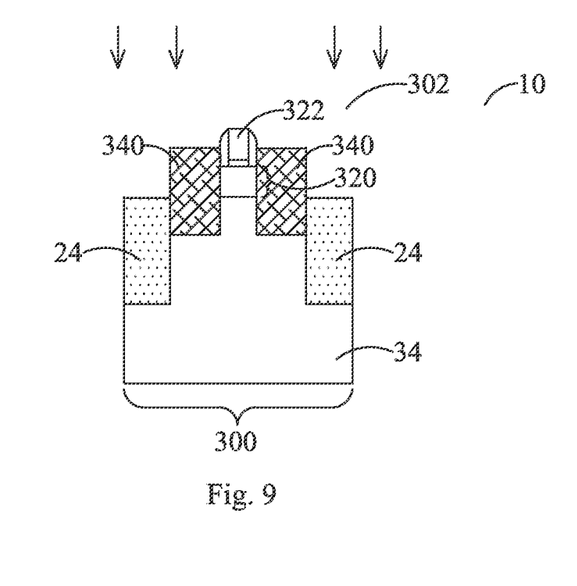

FIGS. 7A and 7B illustrate a top view and a cross-sectional view, respectively, of a starting structure, wherein gate electrode 322 is formed on a top surface and sidewalls of semiconductor fin 320. Next, as shown in FIG. 8, recesses 338 are formed by etching semiconductor fin 320. Epitaxy regions 340 are then grown in recesses 338, as shown in FIG. 9. Epitaxy regions 340 may be formed of silicon germanium, for example. An implantation is then performed to dope epitaxy regions 340 with a p-type impurity. In an exemplary embodiment, the resulting device 302 may be a p-type FinFET, which may be used in the core circuit, an SRAM circuit, an IO circuit, or the like. The doped epitaxy regions 340 may form the source and drain stressors of FinFET 302, so that a compressive stress may be applied to the channel region of p-type device 302 in order to improve the drive current.

In conventional processes for forming the p-type region of the IO ESD diodes, the large p-type regions, which was formed simultaneously with (and hence was coupled with) the formation of silicon germanium stressors of p-type devices, were often thin. As a result, high leakage currents may be generated in the IO ESD devices since the contact plugs of the IO ESD devices may penetrate through the p-n junction of the resulting ESD diodes. Experiment results indicated that by decoupling the formation of p-type epitaxy regions of the ESD diodes from the formation of silicon germanium stressors of p-type FinFETs, silicon regions, rather than silicon germanium regions, may be formed to act as the large p-type epitaxy regions. As a result, the thickness of the large p-type epitaxy region may be close to the thickness of small epitaxy regions. For example, in FIG. 3C, the thickness of p-type epitaxy region 140' may be close to the thickness of p-type epitaxy region 140". Accordingly, with a uniform thickness, contact plugs are unlikely to penetrate through the p-n junctions of the ESD diodes, and the leakage currents in the ESD diodes are reduced. In the embodiments, since the large p-type epitaxy regions of ESD diodes are formed simultaneously with the formation of n-type devices, no extra process steps are needed, and no extra lithography masks are needed.

In accordance with embodiments, a method includes forming an ESD diode including performing an epitaxy growth to form an epitaxy region comprising silicon and substantially free from germanium. The epitaxy region is doped with a p-type impurity to form a p-type region, wherein the p-type region forms an anode of the ESD diode.

In accordance with other embodiments, a method includes forming a first plurality of semiconductor fins parallel to each other, and forming a first plurality of gate electrodes parallel to each other. Lengthwise directions of the first plurality of gate electrodes are perpendicular to lengthwise directions of the first plurality of semiconductor fins. The first plurality of gate electrodes is on top surface and sidewalls of portions of the first plurality of semiconductor fins. The method further includes forming a second semiconductor fin, and forming a second gate electrode on a top surface and sidewalls of a portion of the second semiconductor fin. Portions of the first plurality of semiconductor fins that are not covered by the first plurality of gate electrodes are etched to form first recesses. Portions of the second semiconductor fin that are not covered by the second gate electrode are etched to form second recesses. An epitaxy growth is performed to grow first epitaxy regions and second epitaxy regions simultaneously. The first epitaxy regions are grown from the first recesses, wherein the first epitaxy regions are merged to form a large epitaxy region. The second epitaxy regions are grown in the second recesses. The large epitaxy region is doped with a p-type impurity to form a p-type region, wherein the p-type region forms an anode of an ESD diode. The second epitaxy regions are doped with an n-type impurity to form source and drain regions of an n-type device.

In accordance with yet other embodiments, a device includes a semiconductor substrate, and an n-well region in the semiconductor substrate. A p-type semiconductor region is disposed over the n-well region, wherein the p-type semiconductor region and the n-well region form a p-n junction of an ESD diode. The p-type semiconductor region is substantially free from germanium.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
  forming an Electro-Static Discharge (ESD) diode comprising:
    forming a first semiconductor fin;
    etching a portion of the first semiconductor fin to foam a first recess;
    performing an epitaxy growth to form an epitaxy region, wherein the epitaxy region is grown from the first recess, and wherein the epitaxy region comprises silicon and is substantially free from germanium; and
    doping the epitaxy region with a p-type impurity to form a p-type region, wherein the p-type region forms an anode of the ESD diode.

2. The method of claim 1 further comprising:
  forming a second semiconductor fin adjacent to and parallel to the first semiconductor fin; and
  etching a portion of the second semiconductor fin to form a second recess, wherein a semiconductor material grown from the first and the second recesses is merged to form the epitaxy region.

3. The method of claim 2, wherein the step of etching the portion of the first semiconductor fin and the step of etching the portion of the second semiconductor fin are performed simultaneously.

4. The method of claim 1 further comprising:
  forming an additional semiconductor fin;
  etching a portion of the additional semiconductor fin to form an additional recess;
  performing an additional epitaxy growth to form an additional epitaxy region comprising silicon and substantially free from germanium in the additional recess, wherein the epitaxy growth and the additional epitaxy growth are performed simultaneously; and doping the additional epitaxy region with an n-type impurity to form an n-type region.

5. The method of claim 4, wherein the n-type region forms a source/drain region of an n-type transistor.

6. The method of claim 1, wherein the epitaxy region is over and contacting an n-well region, and wherein the n-well region forms a cathode region of the ESD diode.

7. A method comprising:

forming a first plurality of semiconductor fins parallel to each other;

forming a first plurality of gate electrodes parallel to each other, wherein lengthwise directions of the first plurality of gate electrodes are perpendicular to lengthwise directions of the first plurality of semiconductor fins, and wherein the first plurality of gate electrodes is on top surface and sidewalls of portions of the first plurality of semiconductor fins;

forming a second semiconductor fin;

forming a second gate electrode on a top surface and sidewalls of a portion of the second semiconductor fin;

etching portions of the first plurality of semiconductor fins not covered by the first plurality of gate electrodes to form first recesses;

etching portions of the second semiconductor fin not covered by the second gate electrode to form second recesses;

performing an epitaxy growth to grow first epitaxy regions and second epitaxy regions simultaneously, wherein the first epitaxy regions are grown from the first recesses, wherein the first epitaxy regions are merged to form a large epitaxy region, and wherein the second epitaxy regions are grown in the second recesses;

doping the large epitaxy region with a p-type impurity to form a p-type region, wherein the p-type region forms an anode of an Electro-Static Discharge (ESD) diode; and doping the second epitaxy regions with an n-type impurity to form source and drain regions of an n-type device.

8. The method of claim 7, wherein the step of etching the portions of the first plurality of semiconductor fins and the step of etching the portions of the second semiconductor fin are performed simultaneously.

9. The method of claim 7, wherein the n-type device is an n-type Fin Field-Effect Transistor (FinFET).

10. The method of claim 7, wherein the first and the second recesses have bottom surfaces lower than bottom surfaces of the first plurality of semiconductor fins and a bottom surface of the second semiconductor fin.

11. The method of claim 7, wherein the first and the second epitaxy regions comprise silicon and are substantially free from germanium.

12. The method of claim 7 further comprising:

forming a third semiconductor fin;

forming a third gate electrode on a top surface and sidewalls of a portion of the third semiconductor fin;

etching portions of the third semiconductor fin not covered by the second electrode to form second recesses;

performing an additional epitaxy growth to grow third epitaxy regions, wherein the first epitaxy regions and the third epitaxy regions are grown in separate process steps, and wherein the third epitaxy regions comprises silicon germanium; and doping the third epitaxy regions with a p-type impurity to form source and drain regions of a p-type device.

* * * * *

UNITED STATES PATENT AND TRADEMARK OFFICE
CERTIFICATE OF CORRECTION

PATENT NO.          : 8,551,841 B2                                    Page 1 of 1
APPLICATION NO.     : 13/345473
DATED               : October 8, 2013
INVENTOR(S)         : Lee et al.

It is certified that error appears in the above-identified patent and that said Letters Patent is hereby corrected as shown below:

In the Claims

Col. 6, line 41, claim 1, delete "foam" and insert --form--.

Signed and Sealed this
Nineteenth Day of November, 2013

Teresa Stanek Rea
*Deputy Director of the United States Patent and Trademark Office*